(12) United States Patent
Campbell et al.

(10) Patent No.: US 9,297,912 B2
(45) Date of Patent: Mar. 29, 2016

(54) SINGLE LAYER 3D TRACKING SEMICONDUCTOR DETECTOR

(75) Inventors: Michael Campbell, Geneva (CH); Thilo Michel, Nürnberg (DE); Jan Jakubek, Hyskov (CZ)

(73) Assignees: CERN—European Organization for Nuclear Resesarch, Geneva (CH); Friedrich-Alexander-Universitat Erlange-Nurnberg, Erlangen (DE); Czech Technical University in Prague, Prague (CZ)

( * ) Notice: Subject to any disclaimer, the term of this patent is extended or adjusted under 35 U.S.C. 154(b) by 207 days.

(21) Appl. No.: 14/346,206

(22) PCT Filed: Sep. 21, 2011

(86) PCT No.: PCT/EP2011/004733
§ 371 (c)(1),
(2), (4) Date: Jul. 30, 2014

(87) PCT Pub. No.: WO2013/041114
PCT Pub. Date: Mar. 28, 2013

(65) Prior Publication Data
US 2014/0332691 A1    Nov. 13, 2014

(51) Int. Cl.
*G01T 1/24*    (2006.01)
*G01T 1/29*    (2006.01)
*H01L 27/146*    (2006.01)
*H01L 31/08*    (2006.01)
*H01L 31/115*    (2006.01)

(52) U.S. Cl.
CPC ............... *G01T 1/2985* (2013.01); *G01T 1/242* (2013.01); *G01T 1/247* (2013.01); *G01T 1/249* (2013.01); *H01L 27/14661* (2013.01); *H01L 31/085* (2013.01); *H01L 31/115* (2013.01)

(58) Field of Classification Search
CPC ........................................................ G01T 1/24
See application file for complete search history.

(56) References Cited

U.S. PATENT DOCUMENTS

| 6,169,287 B1 * | 1/2001 | Warburton ................ 250/370.1 |
| 2006/0054828 A1 | 3/2006 | Fritzler et al. ............. 250/370.1 |
| 2010/0051818 A1 * | 3/2010 | De Geronimo .......... 250/370.01 |
| 2011/0155918 A1 | 6/2011 | Bouhnik et al. ......... 250/370.14 |

FOREIGN PATENT DOCUMENTS

| WO | WO 2006/022583 A1 | 3/2006 | .............. G01T 1/24 |
| WO | WO 2007/144624 A2 | 12/2007 | .............. G01T 1/24 |
| WO | WO 2011/001610 A1 | 1/2011 | .............. G01T 1/16 |

OTHER PUBLICATIONS

Marek Kostrzewa, Authorized officer, European Patent Office, International Search Report—Application No. PCT/EP2011/004733, dated Sep. 3, 2012 (3 pages).

* cited by examiner

*Primary Examiner* — David Porta
*Assistant Examiner* — Hugh H Maupin
(74) *Attorney, Agent, or Firm* — Sunstein Kann Murphy & Timbers LLP (57) ABSTRACT

The present invention relates to a pixel detector (10), comprising a semiconductor sensor layer (12), in which charges can be generated upon interaction with particles to be detected. The semiconductor layer defines an X-Y-plane and has a thickness extending in Z-direction. The detector further comprises a read-out electronics layer (14) connected to said semiconductor layer (12), said read-out electronics layer (14) comprising an array of read-out circuits (20) for detecting signals indicative of charges generated in a corresponding volume of said semiconductor sensor layer (12). The neighboring read-out circuits (20) are connected by a relative timing circuit configured to determine time difference information between signals detected at said neighboring read-out circuits (20). The time difference information is indicative of a difference in the Z-components of the locations of charge generations in the corresponding neighboring sensor volumes caused by a particle trajectory that is inclined with respect to the X-Y-plane.

30 Claims, 6 Drawing Sheets

SINGLE LAYER 3D TRACKING SEMICONDUCTOR DETECTOR

FIELD OF THE INVENTION

The present invention is in the field of particle detecting devices. Herein, the term "particle" refers to any type of radiation quanta, including photons. In particular, the present invention relates to a pixel detector comprising a semiconductor sensor layer and a read-out electronics layer to the semiconductor layer.

DESCRIPTION OF THE RELATED ART

Pixel detectors according to the preamble of claim 1 are known from prior art. The pixel detector of the preamble of claim 1 comprises a semiconductor sensor layer in which charges can be liberated upon interaction with particles to be detected. Ionizing radiation produces free electrons and holes in the semiconductor material. The number of electron-hole pairs generated is proportional to the energy transmitted by the particle to the semiconductor material. The detector further comprises a read-out electronics layer electrically connected to the semiconductor layer. For example, the read-out electronics layer may be electrically connected to the semiconductor by bonding. The corresponding detector device is then sometimes referred to as a "hybrid detector". However, the electronics layer and the semiconductor may also be formed in a monolithic way, as is the case in so-called "monolithic active pixel detectors", which would also fall under the terms of a pixel detector according to the preamble of claim 1.

In a pixel detector, the read-out electronics layer comprises an array of read-out circuits each for detecting signals indicative of charges generated in a corresponding volume of the semiconductor sensor layer. Accordingly, each individual read-out circuit provides a pixel in a detector output image of the radiation field. For this reason, the individual read-out circuits of said array are sometimes referred to as "pixels" in the art, although strictly speaking they are only devices for contributing a pixel of the detector image.

An example of a prior art hybrid pixel detector is based on the so-called "Timepix" read-out chip, which constitutes a read-out electronics layer that can be bonded to an appropriate semiconductor layer. In the Timepix read-out chip, the individual read-out circuits are arranged in an array such as to determine the energy deposited in the adjacent semiconductor sensor material volume by detecting the charge generated therein. An overview of the Timepix technology is given in the review article "Ten years of the Medipix2 collaboration" by Michael Campbell, Nuclear instruments and methods in physics research A, 633 (2011) and further references given therein.

Simply put, a hybrid pixel detector can be thought of as a digital camera except that it does not exclusively detect visible light, but different types of high energy radiation instead. The output of the hybrid pixel detector is a "snapshot" of a radiation field that is similar to what has been traditionally visualized in a bubble chamber.

While such pixel detectors offer remarkable advantages with regard to robustness, sensitivity and versatility, by construction they can only provide two-dimensional information of a radiation field. If three-dimensional information about particle trajectories or events is desired, a plurality of pixel detectors has to be used, for example one stacked above the other.

US 2006/0054828 discloses a detector arrangement for a medical diagnosis apparatus in which an X-ray or gamma radiation striking the detector are detected and evaluated with spatial resolution. When an X-ray or gamma quantum strikes the detector, the spatial distribution of sensor elements that are affected within a read-out cycle are obtained. The angle of incidence can then be statistically associated with the size of the area of affected pixels.

SUMMARY OF THE INVENTION

The problem underlying the invention is to provide a detector based on pixel detector technology that allows for obtaining three-dimensional radiation information in an efficient manner. This problem is solved by a pixel detector according to claim 1. Preferable embodiments are defined in the dependent claims.

According to the invention, in the pixel detector neighbouring read-out circuits are connected by a relative timing circuit configured to determine time difference information between signals detected at said neighbouring read-out circuits. The time difference information is indicative of a difference in the Z-components of the locations of charge generations in corresponding neighbouring sensor volumes caused by a particle trajectory that is inclined with respect to the X-Y-plane. Herein, the semiconductor layer defines an X-Y-plane having a thickness extending in Z-direction.

According to the invention, when detecting the interaction of a particle travelling along a trajectory within the semiconductor material, the Z-component, i.e. the location in thickness direction of the semiconductor sensor, is accounted for. Although the semiconductor sensor layers of prior art pixel detectors had a certain thickness, the location of charge generation in thickness direction was never accounted for, since by the construction of the read-out electronics layer, only the position of charge generation in X- and Y-dimension was measured. In other words, even if the particle trajectory should be inclined with regard to the single semiconductor sensor layer, in general only the projection of the trajectory onto the X-Y-plane was detected.

However, the inventors have found that information about the Z-component of the location of charge generation can be extracted by accounting for the drift time of charge from the location of its creation to the corresponding electrode connected with the read-out circuit. The longer the drift time, the further away is the location of charge generation from the read-out circuit electrode. Note that the term "charge generation" is a short way of saying that charges are liberated in the formation of an electron-hole pair, which is then separated due to the electric field across the semiconductor layer. Since only a charge of one polarity drifts toward the read-out electronics, from the detector point of view, the corresponding charges are "generated", and this wording is used throughout the specification for simplicity, bearing in mind that charges are not literally "generated" but liberated in electron-hole-pairs.

Note that in gas detectors, drift times have in the past already been accounted for in the construction of event locations based on arrival time measurements. These devices have been referred to as "time projection chambers". In gas detectors, charges of single electrons are amplified prior to detection. In the typical application, a high energy particle liberates single electrons from gas atoms as it crosses the gas volume. The electrons drift in an electric field in the gas volume and are amplified in a high field strength area above the read-out electronic such as to electron charge avalanches that can be detected. However, in gas detectors, drift times are much longer than in a single semiconductor layer which makes three-dimensional reconstruction more straightforward.

Further, in gas detector based time projection chambers, absolute arrival times of charge signals were recorded. If the same concept was carried over to single semiconductor sensor layers, due to the much shorter drift times, a very high time resolution in the ns or even sub-ns regime would be necessary. Accordingly, it would appear that a very fast global clock is required, which in turn leads to a very high power consumption. However, moderate power consumption is actually one of the important assets of semiconductor pixel detector technology that one would not wish to compromise.

According to the invention, time difference information on the ns or even sub-ns scale is obtained without employing a corresponding high speed clock. Instead, according to the invention, neighbouring read-out circuits are connected by a relative timing circuit configured to determine time difference information between signals detected at said neighbouring read-out circuits. As will be shown below, these "inter-pixel" relative timing circuits allow to measure relative timings with great precision and without having to employ a high power consuming fast clock. Still, as also shown below, from this time difference information the relevant three-dimensional information can be reconstructed.

Preferably, each read-out circuit is accommodated in the footprint of the corresponding volume of the semiconductor sensor layer, and the relative timing circuits are integrated in the same read-out electronics layer. Preferably, both the individual read-out circuits and the relative timing circuits arranged between neighbouring read-out circuits are integrated on the same read-out chip that is bonded to the semiconductor sensor layer. This way, the same compactness can be achieved as in ordinary two-dimensional pixel detectors, while at the same time providing three-dimensional information. While the semiconductor layer of course is always a three-dimensional object defining a two-dimensional X-Y-plane and having a thickness extending along the Z-direction, the array of read-out circuits need not be two-dimensional, but could in some embodiments be a one-dimensional array, thereby defining a row of pixels rather than a two-dimensional matrix.

In a preferred embodiment, the ratio of the thickness d to the pitch a of read-out circuits in the array of read-out circuits is $$\frac{d}{a} > 5,$$

preferably $$\frac{d}{a} > 10.$$

This type of aspect ratio is particularly suitable for extracting three-dimensional information from a single semiconductor sensor layer.

Preferably, the thickness of the semiconductor sensor layer is between 100 μm and 500 mm, and more preferably between 100 μm and 10 mm. Further, the pitch a of read-out circuits in said array of read-out circuits is preferably between 10 μm and 1 mm, more preferably between 30 μm and 80 μm.

Further, the semiconductor material of the sensor layer is preferably one of a group consisting of Si, Ge, CdTe, CdZnTe, GaAs and diamond.

In a simple embodiment, the time difference information comprises binary information only, indicating which one of the two neighbouring read-out circuits received the signal first. In some embodiments, this may already be sufficient information, as it basically encodes the sign of the slope of the trajectory in Z-direction.

Preferably, however, the time difference information comprises information about the length of the time span between receiving signals at the respective ones of the neighbouring read-out circuits. Considering a certain drift velocity, this time span translates directly to a spatial difference of the events of two adjacent pixels in Z-direction or, in other words, the slope of the trajectory with regard to the Z-component. Note that by integrating over the slope, the Z-components of the trajectory can be reconstructed.

In a preferred embodiment, the relative timing circuit comprises a winner-takes-all circuit having two inputs, each connected with one of the neighbouring read-out circuits, said winner-takes-all circuit providing a binary output indicating which of the two inputs received a signal first. Designs for such winner-takes-all circuits are per se known in the art. Note in this regard, however, that this way qualitative timing information on a ns or even sub-ns time scale is automatically recorded without having to employ a correspondingly fast clock. Instead, this information is obtained from a rather simple circuit that can be accommodated on the same chip as the array of read-out circuits.

In a preferred embodiment, the relative timing circuit comprises an XOR gate, wherein each of the inputs of the XOR gate is connected to one of the neighbouring read-out circuits. Accordingly, the output of the XOR gate is "high" or "true" only as long as one of the inputs is high and the other one is low or, in other words, at a time when a signal has been detected at one read-out circuit but not yet at its neighbour.

The output of said XOR gate is preferably connected with a device for measuring the time span during which the output of the XOR gate is "true", which corresponds to the time delay between the arrival of signals at neighbouring read-out circuits. While these time spans will be very short, again no fast clock is necessary for measuring this time span. Instead, the output of the XOR gate may e.g. be connected with a capacitor charged while the output of the XOR gate is "true". The charge accumulated on the capacitor is a measure for the time span, hence providing quantitative timing information.

An alternative means for measuring the arrival time difference between neighbouring pixels could be based on a design in which a local oscillator is started when one pixel is hit and stopped when the neighbouring pixel is hit. The output of the oscillator would be connected to a fast counter and its content would be a measure of the delay. Clearly, this embodiment would be more power consuming than charging a capacitor. Nevertheless, unlike providing a global fast clock, this embodiment would only consume power when a particle is actually being detected. Accordingly, this demonstrates how restriction to relative time measurements between neighbouring pixels allows for power saving, even if a fast clock or counter is not entirely dispensed with.

In a preferred embodiment, the inputs of the XOR gate are latched such that the XOR gate is only sensitive to the rising edge of the respective inputs.

In a preferred embodiment each read-out circuit comprises a discriminator logic configured to compare an input signal voltage with a predetermined threshold and to output a high signal if said input signal voltage exceeds the predetermined threshold. Using such discriminator logic, it can be assured that only signals of a predetermined strength will be recorded, which allows to effectively suppress noise. Note that by varying the discriminator threshold value, also certain energy ranges can be selected.

Further, the read-out circuit preferably comprises a time-over-threshold (ToT) circuit configured to determine the time that the output of the discriminator exceeds a given threshold. Herein, the time-over-threshold is an indication of the charge generated in the corresponding sensor volume, or in other words, the energy deposited in the corresponding sensor volume.

Further, each read-out circuit preferably comprises a charge sensitive amplifier (CSA) for amplifying the charge generated in the corresponding sensor volume, wherein the output of the charge sensitive amplifier is connected with the input of the aforementioned discriminator logic.

In a preferred embodiment, the pixel detector further comprises an evaluation unit connected to said read-out electronic layer, wherein the evaluation unit is suitable for constructing Z-coordinate information of particle trajectories based on time difference information from neighbouring read-out circuits. As mentioned before, if the time difference information is limited to binary information indicating which one of two neighbouring read-out circuits received a signal first, at least the sign of the slope of the trajectory can be determined. In some applications, this information may already be valuable and sufficient. However, if, as in the preferred embodiment, also the length of the time span between receiving signals at the respective ones of said neighbouring read-out circuits is determined, this time span can be translated to a difference in Z-component by multiplication with a charge drift velocity in the semiconductor sensor material. Further, from multiple differences in Z-component between all pairs of neighbouring pixels along the trajectory, the entire Z-component of the trajectory can be reconstructed up to an unknown offset by summation of the differences in the Z-coordinates measured between neighbouring pixels.

In a preferred embodiment, the evaluation unit is configured to account for the time-over-threshold information associated with each read-out circuit such as to correct for a time-walk in the time difference information. In the art, the "time-walk" refers to an effect that occurs if simple threshold triggering is applied to signals having rise times that are considerably longer than the desired time resolution, and where signals of different amplitude are considered. For example, an incoming signal with comparatively large amplitude will reach the threshold earlier than an incoming signal having smaller amplitude but an identical rise time even if the maxima of the two signals were simultaneous. This timing difference that is essentially due to the different amplitudes of the signal is called "time-walk". However, the time-walk can be corrected for if the amplitude of the signal is known, which in turn can be discerned from the time-over-threshold information. Alternatively, it is also possible to use a constant fraction discriminator. In this case, no time-walk will occur, as the timing of the signal independent of the pulse height.

As is apparent from the above discussion, the new pixel detector allows for obtaining 3-dimensional information employing only a single semiconductor sensor layer, and it does so without requiring a global fast clock or actually any fast clock at all. Herein, a "fast clock" is a clock that would allow resolving relevant drift time differences due to particle trajectories that are inclined with regard to the X-Y-plane. By dispensing with such "fast clock", the power consumption of the pixel detector can be kept very moderate.

With these advantages, the new pixel detector should find many important applications. For example, the pixel detector would be ideally suited for use in a Compton camera. A Compton camera allows for reconstructing γ-ray emitting radio isotope distributions based on electrons generated due to Compton scattering. For this, clearly three-dimensional information about the γ particle and/or Compton electron trajectories is necessary. With the pixel detector of the invention, this can be obtained with robust, simple and affordable means. This is believed to be particularly attractive for use in Compton cameras employed in nuclear medicine diagnosis devices, and in particular in a SPECT device. However, a Compton camera employing the pixel detector of the invention could also be very advantageously employed in a device for monitoring decommissioning of nuclear power plants.

The pixel detector of the invention is further believed particularly useful in Hadron therapy devices and in particular, proton therapy devices for examining the radiation field.

Finally, the pixel detector is believe to be also particularly advantageous for use in neutron imaging devices, such as for homeland security applications, or in x-ray polarimetry applications.

DESCRIPTION OF THE PREFERRED EMBODIMENT

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device and method and such further applications of the principles of the invention as illustrated therein being contemplated therein as would normally occur now or in the future to one skilled in the art to which the invention relates.

Figure 1:
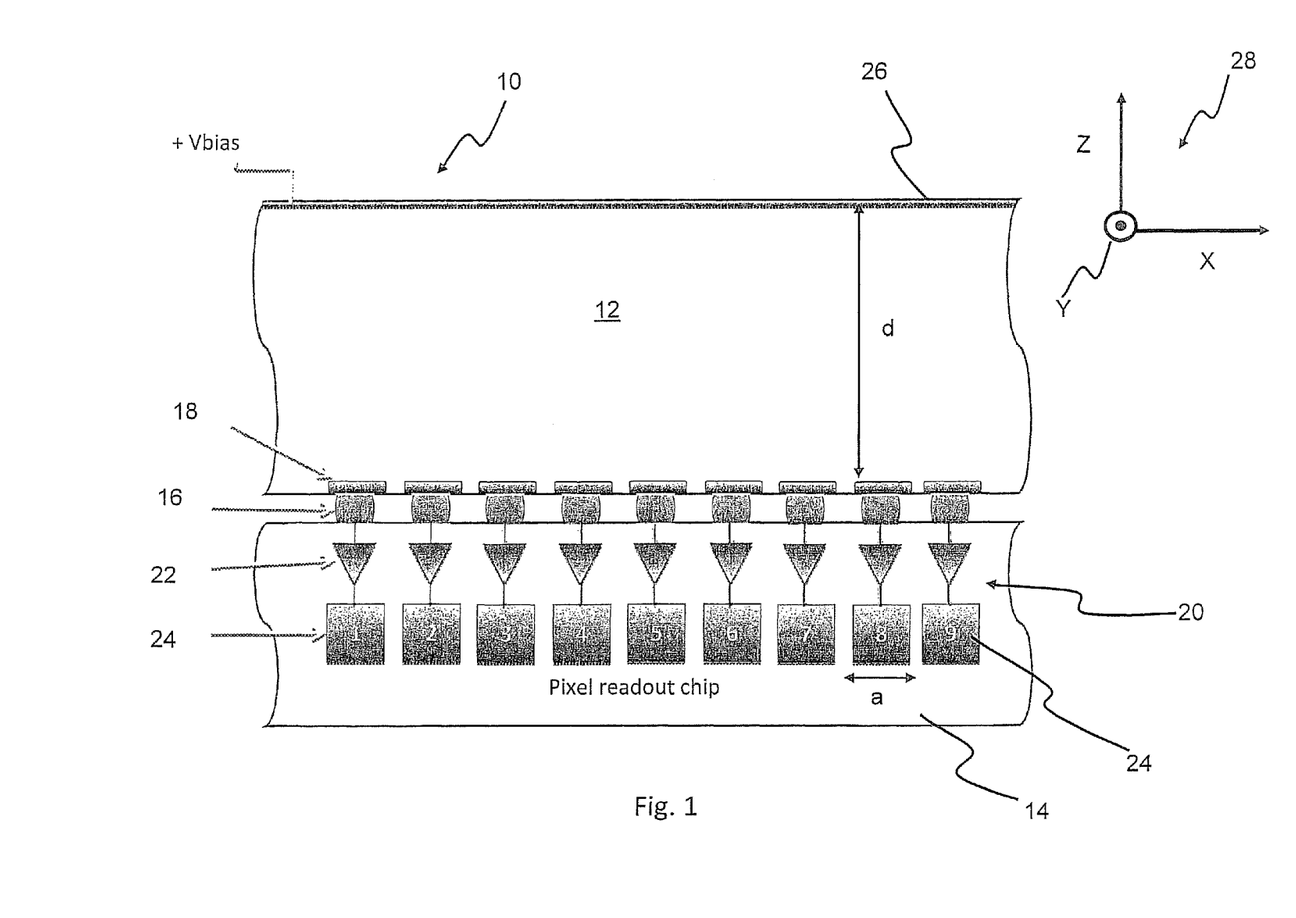
FIG. 1 is a sectional view of a pixel detector according to an embodiment of the invention.

FIG. 1 is a sectional view of a pixel detector 10 according to an embodiment of the present invention. The pixel detector 10 comprises a semiconductor sensor layer 12, which in the present example is comprised of silicon. The pixel detector 10 further comprises a read-out electronics layer formed by a pixel read-out chip 14. The pixel read-out chip 14 is bonded via bump bonds 16 with collection diodes 18 of the semiconductor sensor layer 12.

On the pixel read-out chip 14, a two-dimensional array of read-out circuits 20 is provided, of which nine are shown in FIG. 1. The pitch a of read-out circuits 20 in the present embodiment is about 50 μm. Each of the individual read-out circuits 20 comprises a charge sensitive preamplifier 22 and a signal processing electronics 24.

In the embodiment shown, the semiconductor sensor layer has a thickness d of 1 mm, which, however, is only exemplary. On top of the semiconductor sensor layer 12, an electrode 26 with a positive bias is provided, causing an electric field across the thickness of the semiconductor sensor layer 12. For simplicity, the thickness direction of the semiconductor sensor layer 12 is referred to as the Z-direction, while the pixel read-out chip 14 and the sensor layer extend in X- and Y-directions, as is indicated by coordinate system 28 in FIG. 1.

Figure 2:
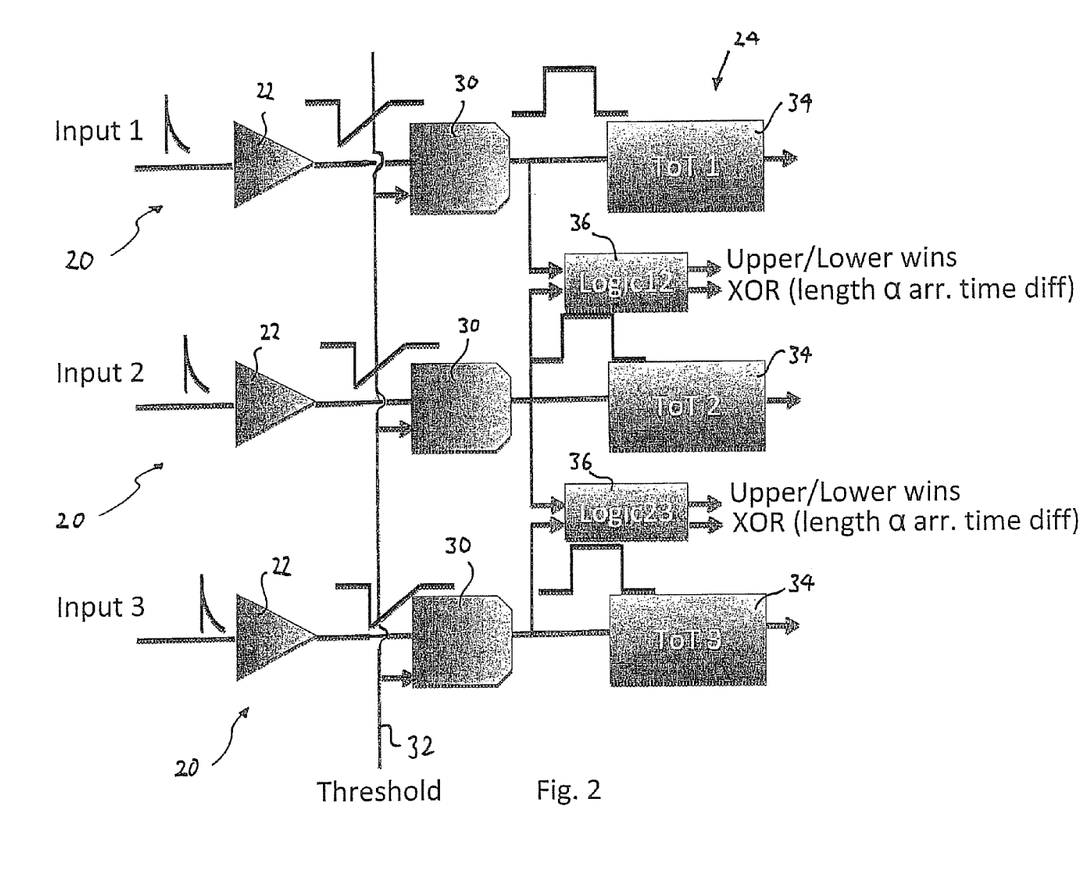
FIG. 2 is a schematic representation of neighbouring read-out circuits connected by relative timing circuits.

In FIG. 2, the structure of the read-out circuit 20 is shown in more detail. FIG. 2 shows three neighbouring read-out circuits 20 for pixels 1, 2 and 3, each comprised of a charge sensitive amplifier (CSA) 22 and the corresponding signal processing electronics 24. As is seen in FIG. 2, each signal processing electronics 24 comprises a discriminator logic 30 having a first input connected with the output of the CSA 22 and a second input connected to a line 32. The discriminator logic 30 compares the CSA output voltage at the first input with the threshold voltage on threshold line 32 at the second input. If and as long as the absolute value of the CSA output exceeds the threshold, the discriminator logic 30 outputs a pulse signal. Instead of processing the signal based on the voltage, the signal processing may alternatively be based on the current. In this regard, the specific embodiment is only exemplary and by no means limiting. Accordingly, whenever reference to a signal is made without explicit mention, the signal could be either a current or a voltage signal.

The output pulse signal of the discriminator logic 30 is fed into a time-over-threshold (ToT) circuit 34, which measures the time-length of the pulse signal outputted from the discriminator logic 30. Note that a clock is needed for measuring the ToT length. However, the ToT-length is still long compared to the arrival time differences of signals at neighbouring read-out circuits 20 that are to be accounted for in the present invention. Accordingly, the clock needed for the ToT-circuits 34 is still slow compared to a clock that would be needed if absolute arrival times of signals at the read-out circuits 20 were measured.

As is further seen from FIG. 2, between each two neighbouring read-out circuits 20 a relative timing circuit 36 is provided. The relative timing circuit 36 has two inputs which are connected with the discriminator logic 30 outputs of the two neighbouring read-out circuits 20. Note that the relative timing circuits 36 are not shown in FIG. 1 for simplicity.

While not shown in FIG. 2 in detail, the relative timing circuit 36 comprises two main components. The first is a winner-takes-all circuit receiving the two inputs to the relative timing circuit 36 and providing a binary output indicating which of the two inputs received a signal first. The second main component of the relative timing circuit 36 is an XOR gate, the inputs of which being likewise connected with the two inputs of the relative timing circuit 36. The output of the XOR circuit is likewise outputted from the relative timing circuit 36.

Next, the operation of the pixel detector 10 will be described with reference to FIGS. 1, 2 and 3.

Figure 3:
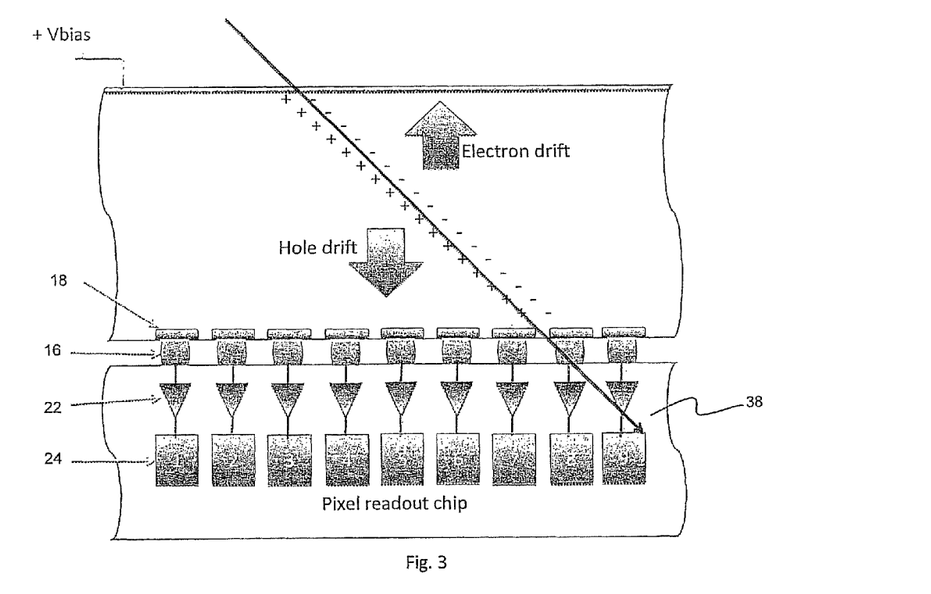
FIG. 3-9 are sectional views corresponding to FIG. 1 showing exemplary particle trajectories that can be recognised with the detector of the invention.

FIG. 3 shows the same cross-sectional view as FIG. 1, but in addition a trajectory 38 of a high-energy particle passing through the semiconductor sensor layer 12 in a direction from left above to right below. Note that in the present disclosure particles do not necessarily need to have a rest mass, so that photons will be regarded as "particles" as well, and in particular x-ray or γ quanta. As the particle 38 traverses through the silicon sensor layer 12, it produces free electrons and holes, where the number of electron-hole pairs is proportional to the energy transmitted by the radiation 38 to the semiconductor sensor 12. Under the influence of the electric field across the semiconductor sensor layer 12, holes will drift toward a collection diode 18 of a corresponding read-out circuit 20. More precisely, with reference to FIG. 3, the holes will generally drift vertically downward, such that all holes generated in a semiconductor volume vertically above a certain collection diode 18 will be detected by the read-out circuit 20 connected thereto. This means that if only the quantity of charge collected at a given collection diode 18 is measured, this is only a measure of the total energy deposited in the volume vertically above the respective collection diode 18. However, from the charge alone, the location of the generation of the charge in Z-direction (i.e. thickness direction) of the semiconductor sensor 12 cannot be discerned. Note that depending on the semiconductor material used the use of a diode like diode 18 is not necessary and that a simple collecting electrode may be used instead.

With further reference to FIG. 3, charge (i.e. holes) that drift toward a given collection diode 18 is fed via the bump bond 16 to a corresponding CSA 22, where the signal is amplified. From the CSA 22, the charge is discharged with a constant current. The output of the CSA 22 is fed into the first input of discriminator logic 30, see FIG. 2. If the voltage at the first input exceeds a voltage on threshold line 32, as mentioned before, the discriminator logic 30 outputs a pulse signal. Accordingly, the discriminator logic 30 blocks signals that are too weak, i.e. correspond to too little charge or, in other words, too little energy deposited in the corresponding pixel volume. This way, noise can be effectively suppressed. Also, by changing the voltage on threshold line 32, a lower energy boundary of events to be recorded can be set. With further reference to FIG. 2, the output of the discriminator logic 30 is fed into the ToT-circuit 34 which measures an effective length of the output of the discriminator logic 30, which is a measure of the total charge collected at the collection diode 18, and hence the energy deposited in the corresponding volume.

Figure 4:
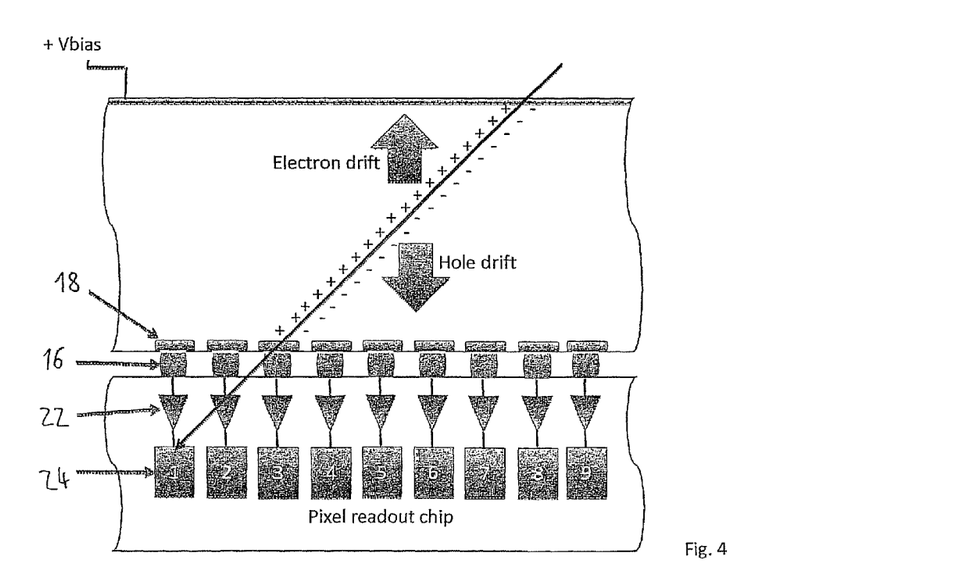

Further, using the winner-takes-all circuit (not shown) of the relative timing circuit 36, it can also be determined which of the two input signals arrives first. The arrival time of the signal will depend on the distance in Z-direction of the location of charge separation from the corresponding collection diode 18. The farther this location is away from the collection diode 18, the more retarded will the signal be. Accordingly, with reference to FIG. 3, it can be assumed that the charge generated by particle trajectory 38 will arrive at the collection diode 18 (or collection electrode) of pixel 5 earlier than that of pixel 4, because the drift distance and hence the drift time is shorter. Note in this regard that the particle moves with the speed of light, so that for practical purposes it can be assumed that the charge is generated simultaneously along the trajectory 38. However, as mentioned before, the different arrival times stem from different drift distances to be covered. Accordingly, the winner-takes-all circuit (not shown) of the relative timing circuit 36 connected between pixels 4 and 5 would output a binary signal indicating that pixel 5 has received the signal earlier. From this information, the sign of the slope of the trajectory 38 can be discerned, i.e. it could be discerned that this trajectory 38 goes from top left to bottom right and not the other way around, as shown in FIG. 4. Instead, for the trajectory shown in FIG. 4, the relative timing circuit 36 would determine that pixel 4 received the signal earlier than pixel 5.

In order to not only estimate the sign of the slope, but the slope itself, the embodiment shown allows to determine the arrival time difference between adjacent pixels. The arrival time difference is the time-length of a state in which one pixel has received the signal while the neighbouring pixel has not received the signal yet. Obviously, this very state is detected by the XOR logic (not shown) included in the relative timing circuit 36. Accordingly, measuring the period of time during which the output of the XOR gate is "high" or "true", one can determine the arrival time difference of signals at the neighbouring pixels. Importantly, although this is a very short period of time e.g. on a ns or sub-ns scale, no fast clock is needed to measure it. Instead, the output pulse of the XOR gate could for example be used to charge a capacitor (not shown) so that the charge accumulated in the capacitor is indicative of the arrival time difference. This way, very short arrival time differences can be measured precisely, without having to provide for a global fast clock, or even for a fast clock at all. Instead, the relevant relative time information can be obtained with comparatively simple relative timing circuits 36 that can be integrated with the same pixel read-out chip 14 as the ordinary read-out circuits 20.

In a practical example it may advantageous to use a latched XOR gate that is sensitive to the rising edges of the signals from the discriminator logics 30 only. Also, using the discriminator outputs as the arrival time triggers will introduce a time-walk if the input signals have different amplitudes, as has been explained in the introductory portion of the specification. However, this time-walk can be corrected based on the energy information of the signal, which is provided by the ToT-circuits 34.

While not shown in the figures, in the preferred embodiment, an evaluation unit is provided that is adapted for constructing Z-coordinate information of particle trajectories based on the time difference information from plural read-out circuits 20. This evaluation unit also receives the ToT-information from the ToT-circuits 34 such as to correct for a time-walk in the time difference information.

So in summary, based on the time difference information provided by the various relative timing circuits 36 connected between neighbouring signal processing circuits 20, the trajectories shown in FIGS. 3 and 4 could be distinguished, although their projection on the X-Y-plane—which is what prior art pixel detectors would only detect—would be practically identical.

Figure 5:
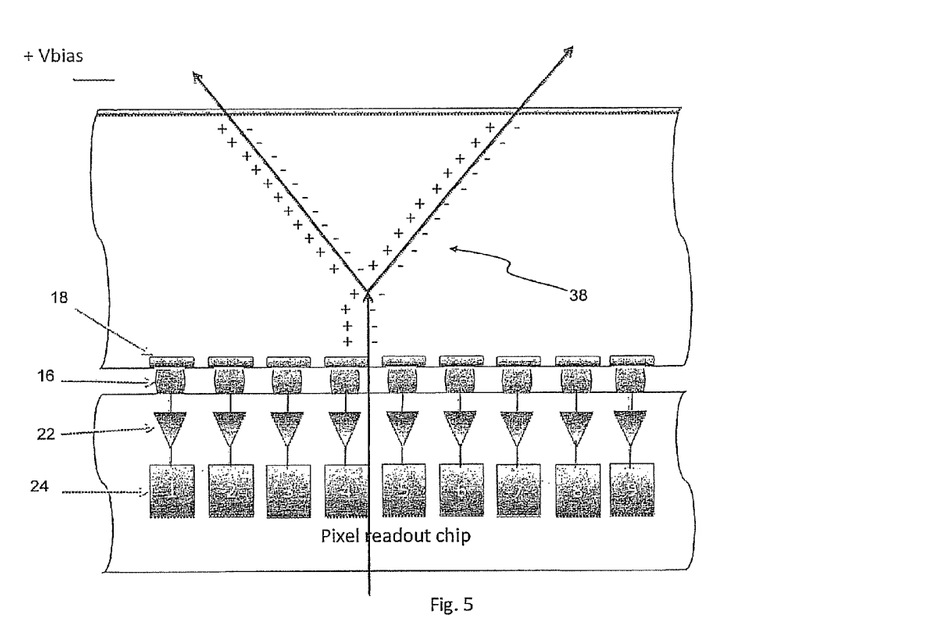
Figure 6:
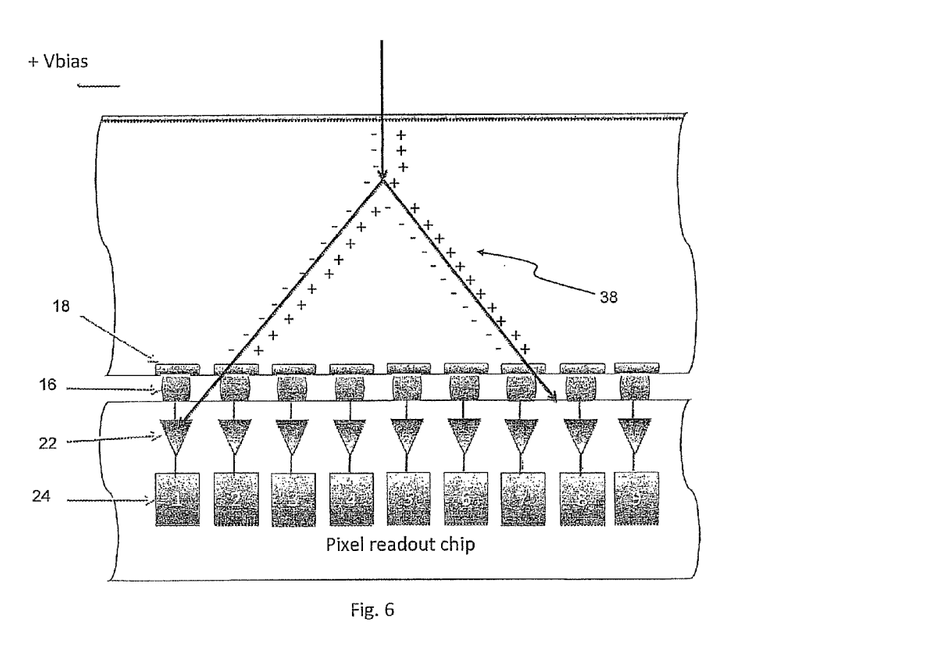

With 3-D trajectory information, more complicated events can be reconstructed, such as the events shown in FIGS. 5 and 6. Clearly, with 2-dimensional information in the X- and Y-plane only, these events could hardly be understood.

Figure 7:
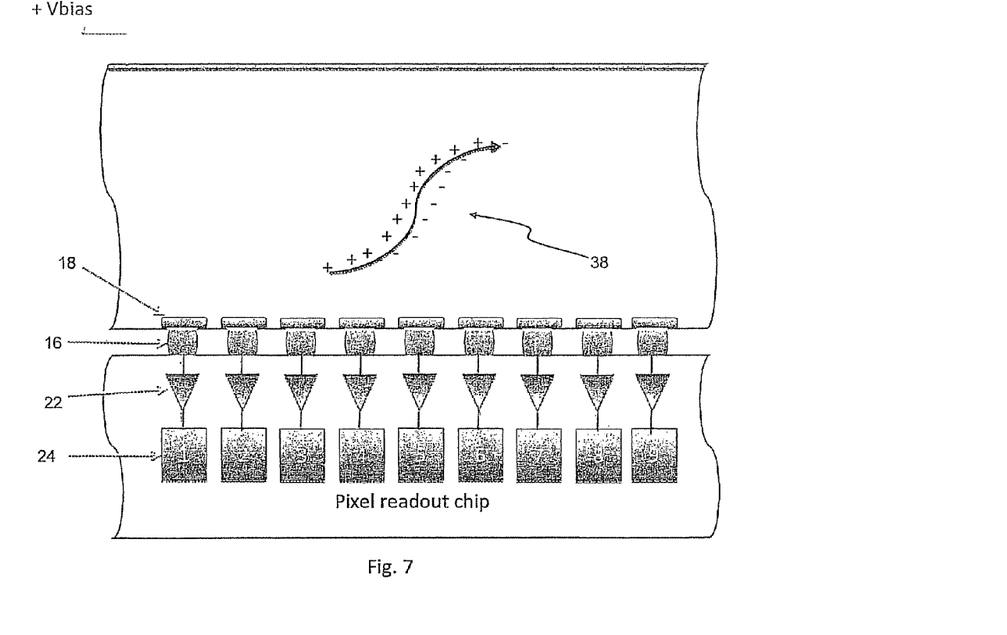

Further, using the 3-D sensing capability, trajectories of lower energy particles such as electrons as shown in FIG. 7 can be reconstructed. FIG. 7 shows a typical "worm-like" pattern of an electron in a pixel detector. This is of particular importance when detecting the direction of Compton electrons generated by scattering of high energy photons. For example, the detector of the invention could be used in so-called Compton cameras used to reconstruct distribution of γ-ray emitting radio isotopes. This will be particular useful in SPECT-applications.

Figure 8:
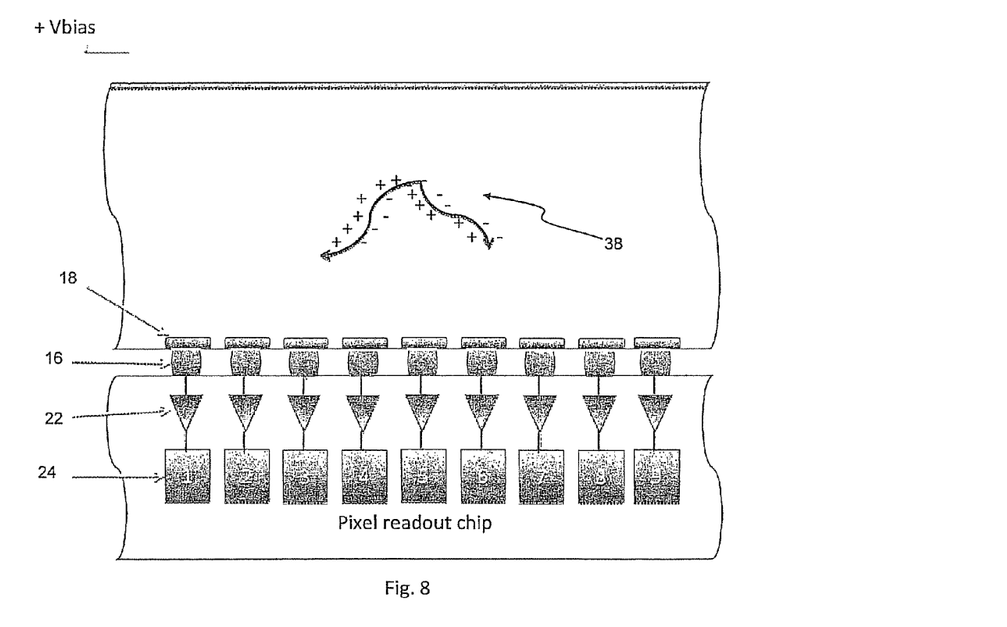
Figure 9:
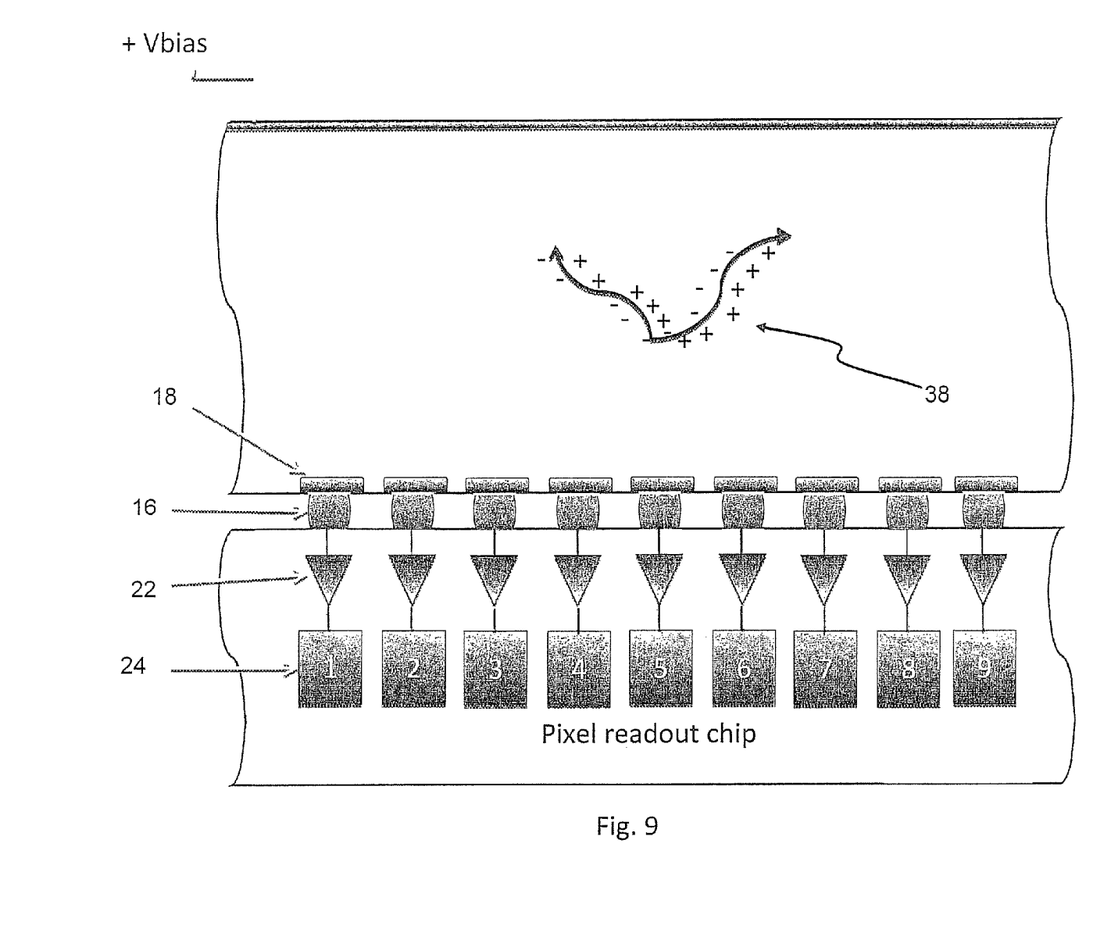

Further, based on the 3-D information, the detector will allow to distinguish the track of FIG. 8 from that of FIG. 7, which with an ordinary 2-D detector would hardly be distinguishable. In fact, it even allows distinguishing the trajectories of FIGS. 8 and 9.

Note that the embodiment of the read-out electronics as shown in FIG. 2 is only exemplary, and that various modifications and alterations can be made without departing from the spirit and scope of the present invention.

For example, it is possible to implement an electronics which compares the two analogue outputs of CSAs of neighbouring pixels with each other rather than with a predetermined threshold, thereby determining which signal arrived first. Further, it is possible to merge the signals from the read-out electrode or read-out diode of two adjacent pixels and compare the merged signal with a single, common discriminator. For example, the signal may be superimposed with reversed polarity, and the absolute value of the merged signal would be compared with the discriminator threshold where the sign of the merged signal indicates which pulse arrived first. In addition, as indicated before, instead of ordinary discriminator logics 30, constant fraction discriminators can be used for both neighbouring pixels prior to taking the decision as to which signal arrived first. This way, a time-walk that otherwise would need to be corrected can be avoided altogether.

The new single layer 3D tracking semiconductor detector has many very promising uses. For example, the pixel detector would be ideally suited for use in a Compton camera. A Compton camera allows reconstructing ray-emitting radio isotope distributions based on electrons generated due to Compton scattering.

A useful application for a Compton camera is in a SPECT device. An ordinary SPECT device (i.e. without Compton camera) makes use of a collimator and a position-sensitive scintillator block. The collimator comprises a number of holes and only passes photons that travel in parallel to these holes. This ordinary design has two drawbacks. First, the positional resolution is not very good due to the comparatively poor resolution of the scintillator detector. The second drawback is that the majority of the photons emitted towards the detector will not even reach the detector because they are absorbed in the collimator. Hence, in order to obtain a sufficient signal in a reasonable time, the dose of the radio nuclide administered to the patient in practice cannot be too low, thereby causing a significant dosage exposure for the patient.

Using a Compton camera, the collimator can be dispensed with. Instead, the Compton camera uses two detector layers. The first layer is a less-absorbing layer with position and energy resolution. This layer is also referred to as a scattering detector, in which photons are preferably not absorbed but in which a Compton scattering occurs. The second detector layer is disposed behind the scattering detector has also energy and position resolution. The photon scattered at the scattering detector is detected with regard to energy and position and is completely absorbed, which is why the second layer is also referred to as the "absorbing detector". The crucial issue in the design of a Compton camera is to provide for a good energy resolution of the scattering detector, because the energy of the Compton electron is needed to reconstruct the Compton scattering angle. This is because in a Compton camera the direction of the impinging photon is no longer known, since no collimator is employed.

The pixel detector of the invention could be ideally used as a scattering detector in a Compton camera. Even if it should not improve the energy resolution for the measurement of the Compton energy, due to the 3D-detection of electron tracks, it gives important information about the angle of the liberated Compton electrons after Compton scattering in the sensor. Due to this additional information about the Compton electron, which can be combined with the Compton electron energy measurement, the requirements on the energy resolution of the scattering detector can actually be relaxed while still improving the image quality.

In fact, it is even conceivable that the second, absorbing detector can be dispensed with altogether. Namely, if the energy resolution in the detector of the invention is sufficient, then the measurement of the angle of the Compton electron can be used to reconstruct the possible direction of the impinging photon with data from the scattering detector alone.

Further important uses of Compton cameras is detecting nuclear waste, contaminated parts, radioactive pollution, dirty bomb contamination etc. Accordingly, Compton cameras can be used on homeland security applications or in the decommissioning of nuclear power plants.

A further advantageous application of the new detector is in hadron therapy, and in particular, proton therapy. In hadron therapy devices, the detector of the invention could be used for monitoring the therapeutic beam to be irradiated into the patient. In addition, it could be used as a particle tracking device during the treatment monitoring.

A further important application of the detector of the invention is in neutron imaging. For detecting neutrons, a converter material, e.g. a plastic material would be placed in front of the semiconductor sensor. By interaction of the neutron with the converter material, a proton can be liberated which would then be detected with the pixel detector of the invention, including three-dimensional information about the proton trajectory. This information can be used, together with knowledge of the energy dependent scattering process of the neutron on a proton, to obtain information about the trajectory of the neutron impinging on the converter material. This way, position resolved angle distributions of the neutron field can be obtained.

What is more, if all neutrons impinge perpendicularly on the converter material, which is the case in neutron transmission imaging, the pixel detector gives precise information about the point of impact of the proton on the semiconductor matrix. Herein, the point of impact would correspond to the pixel with the Z-coordinate which is the farthest away from the read-out circuit side of the semiconductor detector material. Determining the point of impact is of particular importance, because the protons, at least for high energies, have comparatively long tracks in the pixel detector. Using the three-dimensional information provided by the detector of the invention, the point of impact can be determined with improved accuracy, thereby improving the position resolution as a whole.

Finally, the detector of the invention can be employed for X-ray or γ-ray polarimetry, e.g. as a means for determining the plane of linear polarization of X- or γ-rays. Namely, with the three-dimensional imaging of the detector of the invention, the tracks of Compton electrons, photo electrons or electron/positron pairs after pair production can be detected, as has been shown above. This is particularly true since the detector of the invention by construction allows for obtaining relative timing information in spite of very small pixel pitches, so that even electron/position pairs are expected to extend over a sufficient number of pixels such that the three-dimensional trajectory can be detected. From this trajectory, the angle of emission of a Compton electron or photo electron or an electron/positron pair can be determined. The angle of emission is related to the direction of the original photon, the conversion process and the direction of the electric field vector of the photon. The distribution of the electrical field vectors of the photons in an impinging photon field is related to the degree and orientation of the plane of linear polarization. Hence, three-dimensional measurements of the trajectories of the particles produced in the scattering process of photons add to the information of the degree and orientation of the plane of linear polarization. Imaging γ- or X-ray polarimeters are e.g. needed as instruments in X-ray or γ-ray satellites for investigation of celestial photon sources.

The embodiments described above and the accompanying figures merely serve to illustrate the detector according to the present invention, and should not be taken to indicate any limitation thereof. The scope of the patent is solely determined by the following claims.

REFERENCE SIGNS 10 pixel detector
12 semiconductor sensor layer
14 pixel read-out chip
16 bump bond
18 collection diode
20 read-out circuit
22 charge sensitive preamplifier
24 signal processing electronics
26 electrode
28 coordinate system
30 discriminator logic
32 threshold line
34 time-over-threshold circuit
36 relative timing circuit
38 particle trajectory
a pitch
d thickness

The invention claimed is:

1. A pixel detector, comprising
a semiconductor sensor layer, in which charges can be liberated upon interaction with particles to be detected, said semiconductor layer defining an X-Y-plane and having a thickness d extending in a Z-direction, and
a read-out electronics layer electrically connected to said semiconductor layer, said read-out electronics layer comprising an array of read-out circuits for detecting signals indicative of charges generated in a corresponding volume of said semiconductor sensor layer,
wherein neighbouring read-out circuits are connected by a relative timing circuit configured to determine time difference information between signals detected at said neighbouring read-out circuits,
said time difference information being indicative of a difference in Z-components of the locations of charge generations in the corresponding neighbouring sensor volumes caused by a particle trajectory that is inclined with respect to the X-Y-plane.

2. The pixel detector of claim 1, wherein each read-out circuit is accommodated in a footprint of the corresponding volume of said semiconductor sensor layer, and said relative timing circuits are integrated in said read-out electronics layer.

3. The pixel detector of claim 2, wherein said relative timing circuits and said read-out electronics layer are integrated on a common chip.

4. The pixel detector of claim 1, wherein each read-out circuit provides a pixel in a detector output image of the radiation field.

5. The pixel detector of claim 1, wherein the ratio of the thickness d to the pitch a of read-out circuits in said array of read-out circuits is $$\frac{d}{a} > 5.$$

6. The pixel detector of claim 5, wherein the ratio of the thickness d to the pitch a of read-out circuits in said array of read-out circuits is $$\frac{d}{a} > 10.$$

7. The pixel detector of claim 1, wherein the thickness d of the semiconductor sensor layer is between 100 μm and 500 mm.

8. The pixel detector of claim 7, wherein the thickness d of the semiconductor sensor layer is between 100 μm and 10 mm.

9. The pixel detector of claim 1, wherein the pitch a of read-out circuits in said array of read-out circuits is between 10 μm and 1 mm.

10. The pixel detector of claim 9, wherein the pitch a of read-out circuits in said array of read-out circuits is between 30 μm and 80 μm.

11. The pixel detector of claim 1, wherein said semiconductor material is one of the group consisting of Si, Ge, CdTe, CdZnTe, GaAs and diamond.

12. The pixel detector of claim 1, wherein the time difference information comprises binary information indicating which one of the two neighbouring read-out circuits received said signal first.

13. The pixel detector of claim 1, wherein the time difference information comprises information about the length of the time span between receiving signals at the respective ones of said neighbouring read-out circuits.

14. The pixel detector of claim 1, wherein said relative timing circuit comprises a winner-takes-all circuit having two inputs, each connected with one of the neighbouring read-out circuits, said winner-takes-all circuit providing a binary output indicating which of the two inputs received a signal first.

15. The pixel detector of claim 1, wherein said relative timing circuit comprises an XOR gate, wherein each of the inputs of the XOR gate is connected to one of the neighbouring readout circuits.

16. The pixel detector of claim 15, wherein the output of said XOR gate is connected with a device for measuring the time span during which the output of the XOR gate is "true", and in particular, a capacitor that is charged while the output of the XOR gate is "true".

17. The pixel detector of claim 15, wherein the inputs of the XOR gate are latched such that the XOR gate is only sensitive to the rising edge of the respective inputs.

18. The pixel detector of claim 1, wherein each read-out circuit comprises a discriminator logic configured to compare an input signal with a predetermined threshold and to output a high signal if said input signal voltage exceeds said predetermined threshold.

19. The pixel detector of claim 18, wherein said read-out circuit comprises a time-over-threshold circuit configured to determine the time that the output of said discriminator logic exceeds a given threshold.

20. The pixel detector of claim 1, wherein each read-out circuit comprises a preamplifier, in particular a charge sensitive amplifier for amplifying the charge generated in said corresponding sensor volume, the output of the charge sensitive amplifier being connected with the input of said discriminator logic.

21. The pixel detector of claim 1, wherein each read-out circuit comprises a constant fraction discriminator.

22. The pixel detector of claim 1, wherein two neighbouring read-out circuits share a discriminator, said shared discriminator receiving pre-amplified signals from two neighbouring read-out electrodes or read-out diodes and determines which signal was received first.

23. The pixel detector of claim 1, further comprising an evaluation unit connected to said read-out electronic layer,
said evaluation unit being suitable for constructing Z-coordinate information of particle trajectories based on time difference information from plural read-out circuits.

24. The pixel detector of claim 23, wherein said evaluation unit is configured to account for said time-over-threshold information associated with each read-out circuit such as to correct for a time-walk in the time difference information.

25. A Compton camera for reconstructing γ-ray emitting radio isotope distributions, said Compton camera comprising a pixel detector according to claim 1.

26. The Compton camera of claim 25, wherein the pixel detector functions as a scattering detector in which Compton scattering of γ-radiation is likely to occur and in which the trajectories of Compton electrons are detected, said detected trajectories serving as information in reconstructing the direction of impinging γ-radiation.

27. The Compton camera of claim 25, wherein said Compton camera is employed in a nuclear medicine diagnosis device, in particular a SPECT device, or a device for monitoring decommissioning of nuclear power plants.

28. A hadron therapy device, in particular a proton therapy device, comprising a pixel detector according to claim 1.

29. A neutron imaging device comprising a pixel detector according to claim 1.

30. An X-ray or γ-ray polarimeter comprising a pixel detector according to claim 1.

* * * * *